United States Patent [19]

Newberg

[11] Patent Number: 4,918,373
[45] Date of Patent: Apr. 17, 1990

[54] R.F. PHASE NOISE TEST SET USING FIBER OPTIC DELAY LINE

[75] Inventor: Irwin L. Newberg, Northridge, Calif.

[73] Assignee: Hughes Aircraft Company, Los Angeles, Calif.

[21] Appl. No.: 169,714

[22] Filed: Mar. 18, 1988

[51] Int. Cl.⁴ .............................................. G01R 27/02
[52] U.S. Cl. ................................ 324/613; 324/77 K; 350/96.29
[58] Field of Search ................ 324/57 N, 77 K, 77 H; 350/96.29

[56] References Cited

U.S. PATENT DOCUMENTS

| 2,896,162 | 7/1959 | Berger et al. | 324/77 H |
| 3,716,785 | 2/1973 | Masters et al. | 324/57 N |
| 4,002,969 | 1/1977 | Barley et al. | 324/57 N |
| 4,002,970 | 1/1977 | Ashley et al. | 324/57 N |
| 4,531,196 | 7/1985 | Lin | 350/358 |
| 4,671,604 | 6/1987 | Soref | 350/96.29 |
| 4,681,395 | 7/1987 | Lindsay et al. | 350/96.29 |
| 4,719,412 | 1/1988 | d'Humieres et al. | 324/77 K |
| 4,755,745 | 7/1988 | Cohen | 324/77 K |
| 4,777,433 | 10/1988 | Steele et al. | 324/77 K |
| 4,801,861 | 1/1989 | Ashley et al. | 324/57 N |

FOREIGN PATENT DOCUMENTS 0252620 1/1988 European Pat. Off. .
924794 5/1963 United Kingdom .

OTHER PUBLICATIONS

Microwave Journal, vol. 26, No. 12, Dec. 1983, (Dedham, MA, US), pp. 10-112, Theory and design of the delay line discriminator for phase noise measurement, IEEE Transactions on Microwave Theory and Techniques, vol. 36, No. 1, Jan. 1988, Noise modeling and measurement techniques, pp. 1-10, FIG. 8.
IEEE Journal of Quantum Electronics, vol. QE-13, No. 4, Apr. 1977, T. R. Ranganath, Ti-diffused LiNbO3 branches-waveguide modulators, pp. 290-295.
The Marconi Review, vol. 32, No. 174, 1969, T. Hair, "The Measurement of frequency modulation noise with a delay line", pp. 217-225.
IEEE Transactions on Instrumentation & Measurement, vol. IM-35, No. 4, Dec. 1986, Measurement of RF signal generator phase noise using a one-generator delay-line method, pp. 496-502.

Primary Examiner—Reinhard J. Eisenzopf
Assistant Examiner—Maura K. Regan
Attorney, Agent, or Firm—Leonard A. Alkov; Wanda Denson-Low

[57] ABSTRACT

A noise test set for analyzing the presence of phase noise in a radar signal. A delay line discriminator using a fiber optic cable and laser light modulated by the radar signal are used. Both direct and indirect modulation techniques are disclosed, together with techniques for generating and injecting a calibration signal.

28 Claims, 3 Drawing Sheets

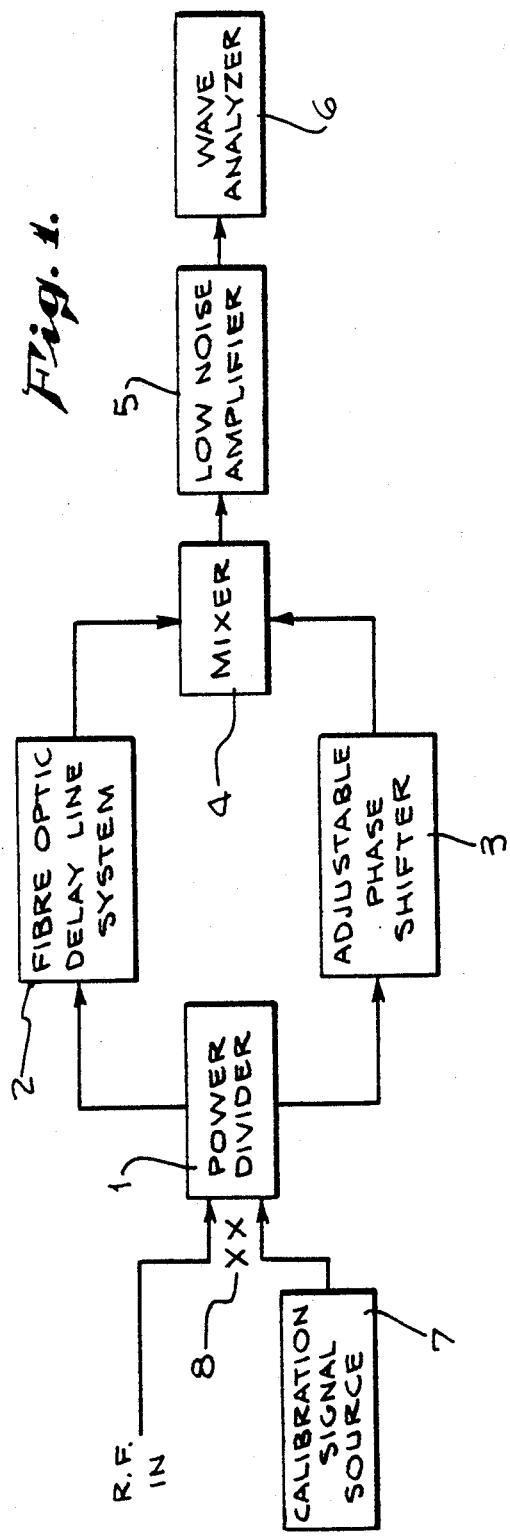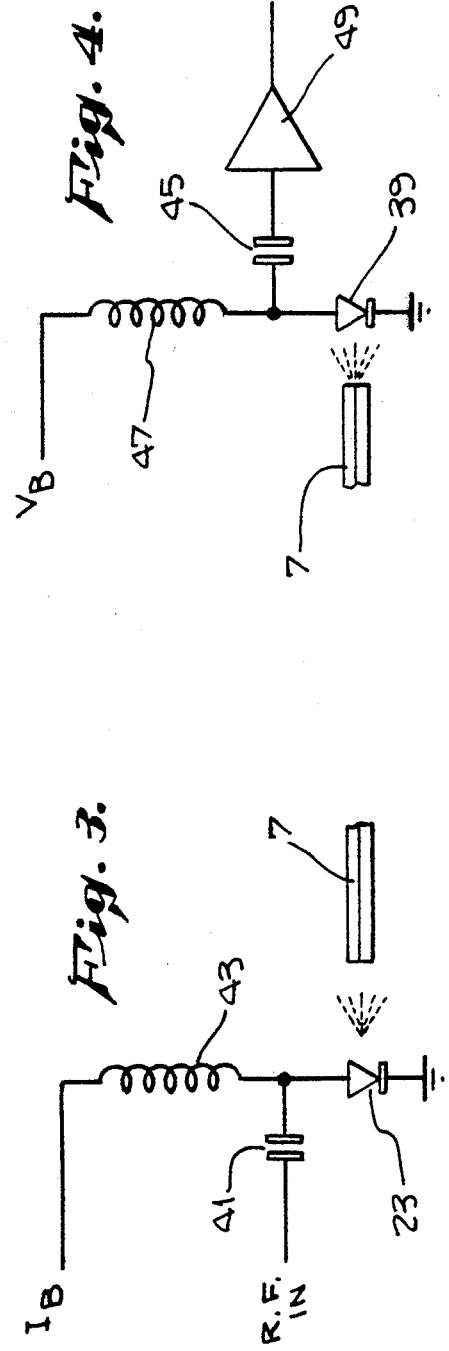

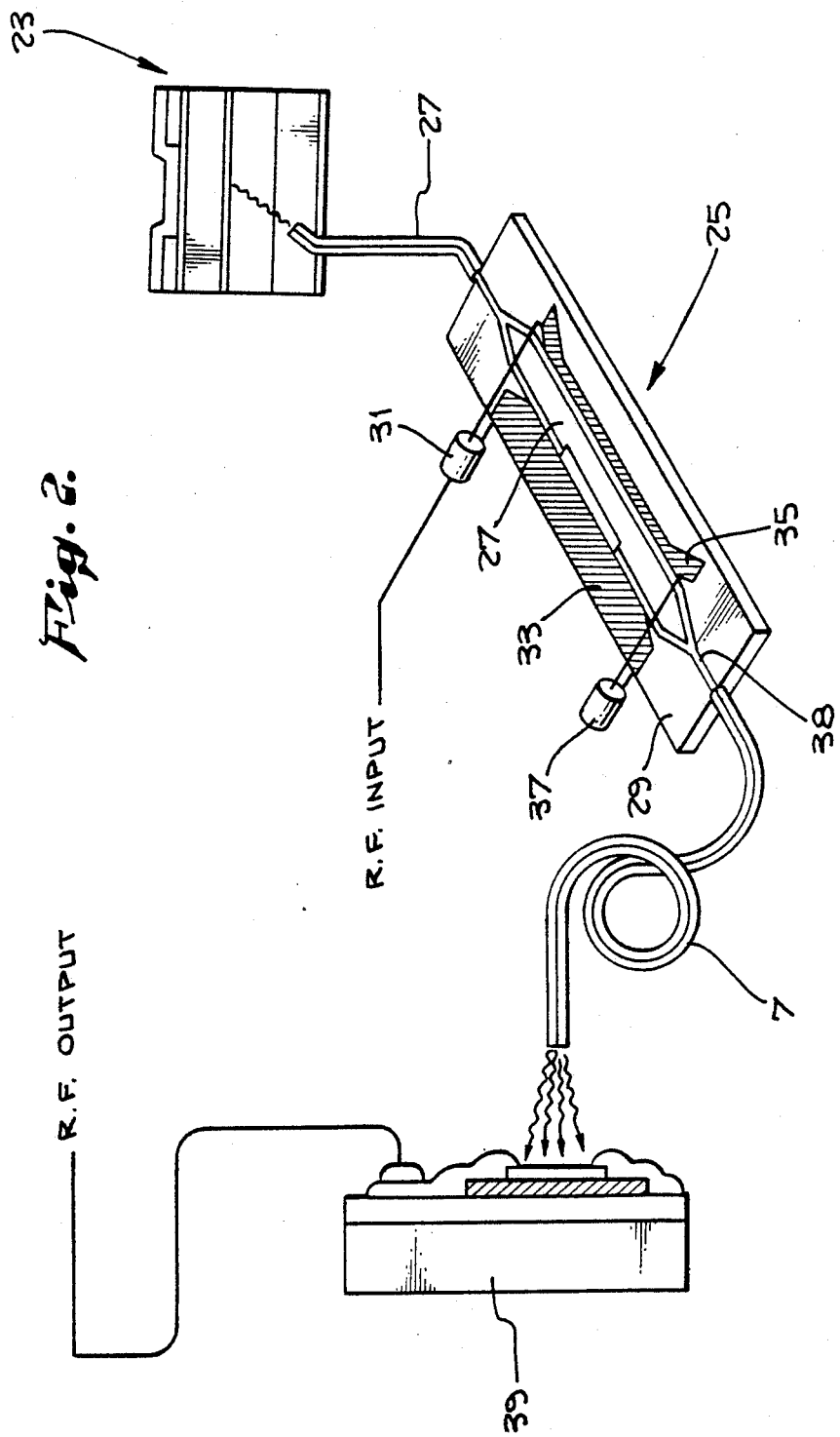

R.F. PHASE NOISE TEST SET USING FIBER OPTIC DELAY LINE

FIELD OF THE INVENTION

This invention relates to devices which measure noise present in R.F. signals and, more specifically, to radar noise test sets which measure random and spurious phase noise present in radar signals. The radar noise test set incorporates a delay line type frequency discriminator which uses a fiber optic cable to produce the needed delay.

BACKGROUND OF THE INVENTION

Oscillators which produce R.F. energy typically generate sideband noises, including thermal noise, shot noise, and flicker noise. This noise is typically random and is referred to as phase noise.

Spurious phase noise signals can also be generated. These consist of discrete signals appearing as distinct components and can be related to known phenomena in the signal source, such as power-line and/or vibration modulation. This spurious noise is also referred to as phase noise.

The presence of phase noise in R.F. signal sources is a concern in several applications, including applications related to frequency conversion, digital communication, and analog communication.

Phase noise is also of great concern in radar equipment, especially Doplar radar equipment which determines the velocity of a target by measuring the small shifts in frequency in the return echoes. When decorrelation techniques are used to measure this frequency shift, the presence of phase noise can partially or even totally mask the target signal.

In order to minimize the amount of phase noise generated by a particular system, it is highly advantageous to be able to measure that phase noise. As a result, there has been a continuing need for equipment which can accurately measure such phase noise.

The most straight forward technique is to connect the test signal to a spectrum analyzer, a device which directly measures the power spectral density of the oscillator. However, this method is limited by the dynamic range and resolution of the spectrum analyzer, as well as the phase noise which the spectrum analyzer itself produces. Moreover, it is difficult with this method to accurately measure phase noise which is close in frequency to the carrier signal.

There are also time-domain techniques which down convert the signal under test to an intermediate frequency. A high-resolution frequency counter is then used to take repeated measurements of the intermediate frequency signal. The frequency differences between the measurements are then used to compute the amount of the phase noise.

Time-domain methods, however, are not well suited for measuring phase noise having a frequency substantially different from the carrier frequency. It is also difficult to utilize such techniques for measuring phase noise that is flat or decreasing slowly in frequency.

Another technique is to demodulate the carrier on which the phase noise is present. However, this technique requires complex phase locking circuitry. Moreover, it does not work well with signal sources which are not constant in frequency.

A still further technique is to use a frequency discriminator which can be implemented in several ways, one of which is a delay line. With this technique, a delay line, phase shifter and detector are used to decorrelate the phase noise present in the R.F. signal source. This converts the phase noise into a baseband signal which can be conveniently measured on a spectrum analyzer.

One principal problem using delay line frequency discriminators are limitations imposed by the delay element.

When a waveguide is used as the delay element, for example, it is very difficult to obtain long delays such as 10 microseconds. Although long delays can be achieved with long lengths of coaxial cable, very high losses result, making measurement of low noise levels very difficult. In addition, coaxial cables are usually quite bulky, making it difficult to change cables when a different length delay is desired.

Another technique mixes the test signal to a lower frequency and then transports that lower mixed frequency signal through a digital, quartz, or surface acoustic wave (SAW) delay line. Such techniques, however, require complex synchronization circuitry, often introduce undesirable distortion, and are bulky.

A still further technique has been to use a cavity resonator as the delay element. This device, however, requires a very high Q to detect low level noise. Unfortunately, high Q resonators are very expensive and are very sensitive to vibration. They also require mechanical adjustment in order to match the desired frequency range.

In short, there has been a continuing need for a noise test set which can accurately measure low level phase noise, especially phase noise that is near in frequency to the carrier frequency.

SUMMARY OF THE INVENTION One object of the present invention is to obviate these and other problems in the prior art.

Another object of the present invention is to provide a noise test set which is simple and inexpensive, but which can accurately measure low level phase noise, including noise which is close in frequency to the signal carrier frequency.

A still further object of the present invention is to provide a radar noise test set which has a very wide band frequency response.

A still further object of the present invention is to provide a radar noise test set which is highly efficient and results in losses which are not primarily a function of the length of the delay device.

A still further object of the present invention is to provide a radar noise test set capable of delaying the tested signal at least 10 microseconds without causing unacceptable losses.

These and other objects of the present invention are achieved through the use of a fiber optic cable as the delay line in a delay line discriminator. More specifically, a laser light is created and modulated with the R.F. test signal. It is then propagated through the fiber optic cable which delays it in time. The delayed modulated laser light is then demodulated, thereby extracting the delayed radar signal for further processing.

A simplified technique for injecting a calibration signal is also disclosed.

These as well as other objects, features, and advantages of the present invention will become apparent from consideration of the following detailed description and accompanying drawings.

BRIEF DESCRIPTION OF THE DRAWINGS

FIG. 1 is a block diagram of the preferred embodiment of the present invention.

FIG. 2 is a pictorial diagram of the fiber optic delay line system shown in FIG. 1, using laser light and an indirect (external) modulation technique.

FIG. 3 is a schematic diagram showing circuitry which directly modulates the laser light.

FIG. 4 is a schematic diagram showing circuitry used to operate the optical detector shown in FIG. 2 to demodulate the laser light.

DETAILED DESCRIPTION OF THE PREFERRED EMBODIMENT

Figure 5:
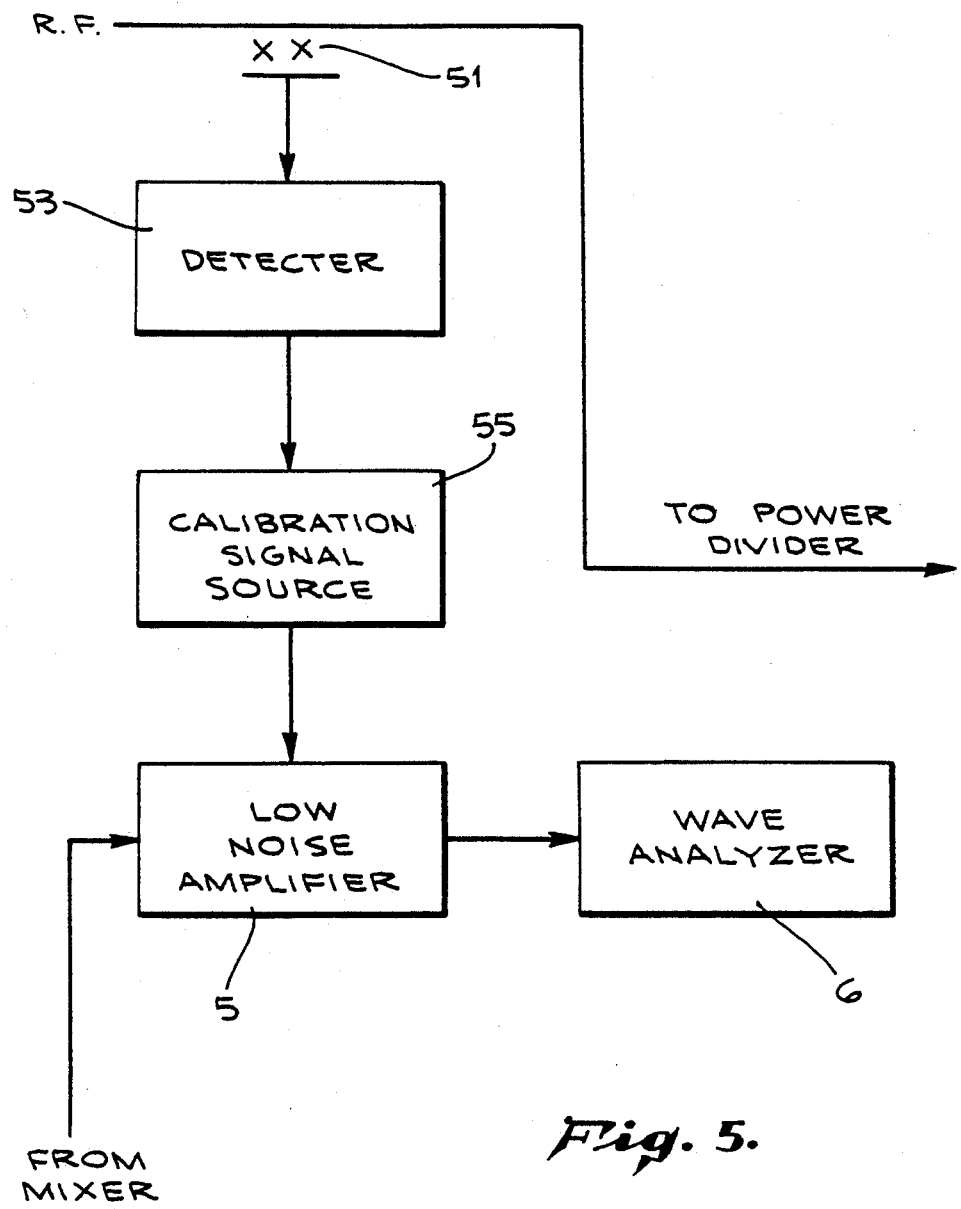
FIG. 5 is a schematic diagram of an alternate technique for developing and injecting the calibration signal source shown in FIG. 1.

FIG. 1 is block diagram of the preferred embodiment to the present invention.

As can be seen in FIG. 1, the signal to be tested (test signal), such as the continuous wave output from a radar exciter, is injected into a power divider 1 which splits the signal into two components.

One component of the signal split from the power divider 1 is delivered to a fiber optic delay line system 2 which causes the delivered signal to be delayed for a predetermined amount of time.

The other component from the power divider 1 is delivered to an adjustable phase shifter 3, typically a ferrite device, which shifts the phase of the signal that is delivered to it by an adjustable amount.

The delayed signal from the fiber optic delay line system 2 and the phase shifted signal from the adjustable phase shifter 3 are then both delivered to a mixer 4. The output of the mixer 4 is amplified by a low noise amplifier 5 and then displayed on a wave analyzer 6.

In operation, the adjustable phase shifter 3 is adjusted for each new test signal so that the R.F. signal which is delivered to the mixer 4 is 90 degrees out of phase with the R.F. signal that is delivered to the mixer 4 from the fiber optic delay line system 2. When so adjusted, the mixer 4 acts as an R.F. phase detector and outputs a steady state D.C. current when no noise is present on the R.F. input signal.

When noise is present on the R.F. input signal, this noise will arrive at the mixer 4 from the adjustable phase shifter 3 before it arrives from the fiber optic delay line system 2. The result will be a change in the relative phase difference of the signals presented to the mixer 4, which will be reflected at the output of the mixer 4 as a variation in the amplitude of its D.C.

In other words, the system thus far described will decorrelate phase noise present on the input R.F. signal and will produce that decorrelated phase noise as an amplitude variation on the D.C. output of the mixer 4. For a greater understanding of how this works, reference is made to the published article Phase Noise and its Effects on Microwave Systems, published in Microwave Systems News and Communications Technology, July 1986 (Vol. 16, No. 7)

The low noise amplifier 5 amplifies the extracted phase noise signal and presents it to the wave analyzer 6 for analysis. To minimize spurious input to the amplifiers, a low pass filter (not shown) may advantageously be inserted between the output of the mixer 4 and the input of the amplifier 5. Typically, the wave analyzer 6 would be a spectrum analyzer which would graphically display the frequency distribution of the phase noise and the relative amplitude of each portion in the distribution.

One way to provide a qualitative analysis is to determine the amplitude of the phase noise relative to the amplitude of the R.F input signal by using a calibration signal source 7.

More specifically, the calibration signal source 7 can be used to generate a very low level noise side band having a precisely-known magnitude relative to the magnitude of the R.F. input signal, typically about 60 db down.

As is known in the art, one way to calibrate the test set is for the calibration signal source 7 to generate the calibration signal by sampling the input test signal. The sampled signal is then mixed with a low frequency signal, having a frequency in the range of the anticipated frequency by which the phase noise is offset from the test carrier. The mixed signal is then shifted in phase by 90° relative to the input test signal and attenuated a known amount with respect to the amplitude of the input signal, and is then injected into the power divider 1 through a coupler 8.

This calibration signal is then interpreted as a phase noise sideband by the system and thus would also appear on the wave analyzer. Since its magnitude with respect to the test signal is precisely known, the magnitude of the real phase noise which is also displayed on the wave analyzer can then easily be calculated. It would simply be the known magnitude of the calibration source signal 7 relative to the input carrier level, compared to the displayed height of the phase noise (for a particular displayed frequency band).

FIG. 2 is a pictorial diagram of the fiber optic delay line system 2 shown in FIG. 1 using laser light and an indirect modulation technique.

More specifically, the fiber optic delay line system 2 includes a light emitting diode 23 which, as is well known in the art, is a semiconductor device which emits a light when current is passed through it. Although any type of light emitting source could be used, a laser diode, i.e. a diode which emits laser light, is preferred.

In order to insure that the emitted laser light is of constant amplitude, the current passed through the laser diode 23 should also be constant.

The laser light emitted by the laser diode 23 is then coupled to a light modulator 25 through a short length of a fiber optical cable 27.

It is important that the coupling from the laser diode 23 to the fiber optic cable 27 be highly efficient, so as to minimize signal losses at the coupling junction. It is also important that reflection of this coupling be kept to a minimum, so as to minimize nonlinearities in the system.

Techniques for minimizing losses and reflection at the coupling junction are well known in the art and should be followed. Alternately, the laser diode 23 can be purchased having already affixed thereto a "pigtail", i.e., a short length of fiber optic material coupled to the laser diode by the manufacturer in a fashion which minimizes loss and reflection.

Although other types could be used within the scope of the present invention, the light modulator 25 in the preferred embodiment is the Mach-Zehnder interferometric modulator described by Gee et al. in their article *17- GHz band with Electro-Ootic Modulator*, published Dec. 1, 1983 in Applied Physic Letters, Vol 43, pp. 998–1000.

Essentially, the light modulator 25 is a device which directs the light through a titanium wave guide 27 which is embedded into a lithium niobate electro-optic crystal 29. The R.F. input which modulates the light comes from the power divider 1 shown in FIG. 1. It is delivered through a transmission line 31 which, in turn, is connected to one end of a pair of conducting coplanar strip lines 33 and 35. The other end of the coplanar strip lines 33 and 35 are terminated by a matching resistance 37.

In operation, the imposition of the R.F. input across the coplanar strip lines 33 and 35 creates an electric field which modulates the intensity of the intervening light in accordance with the intensity of the electric field. For more information concerning the structure and operation of the light modulator 25, the referenced article by Gee et al. should be reviewed.

The light output 38 of the light modulator 25 is then coupled to one end of the fiber optic cable 7. The other end of the fiber optic cable 7 is coupled to an optical detector (photo detector) 39 which, as is well known in the art, is a semiconductor device which produces a current which is directly proportional to the intensity of the light, thereby demodulating the delayed R.F. signal. The delayed R.F. is then delivered to the mixer 4 shown in FIG. 1. Other demodulation techniques could also be used within the scope of the present invention.

As with the laser diode 23, it is also important to efficiently couple the output of the fiber optic cable 7 to the optical detector 39 so as to minimize losses and reflection, all in accordance with techniques well known in the art. Optical detectors can also be purchased with a pigtail of fiber optic material already attached to the optical detector in a fashion which is efficient and results in minimum reflection. If an optical detector is selected which already has a pigtail attached by the manufacturer, this can be conveniently connected to the fiber optic cable 7 by a fiber optic connector or any of the other well known techniques for efficiently joining separate fiber optic cables.

The modulation technique pictorially illustrated in FIG. 2 is known as indirect (or external) modulation because the light intensity is not modulated until after it is created.

FIG. 3 is a schematic diagram of an alternate embodiment of the light source and modulator 5 shown in FIG. 1. This embodiment uses a direct modulation technique. The light intensity is modulated at the very moment of its creation.

FIG. 3 consists of the laser diode 23 having one end connected to ground and the other connected to a capacitor 41 and an inductor 43. The other end of the capacitor 41 is connected to the input R.F. signal, and the other end of the inductor 43 is connected to a constant source of D.C. current $I_B$.

This configuration is known as a bias-tee network.

The purpose of the constant D.C. current $I_B$ is to bias the laser diode 23 such that it always operates in its linear region during modulation. Although the exact amount of this current will vary depending upon the specific choice for the laser diode 23, typical bias currents will be in the order of 70–100 milliamps.

The purpose of the capacitor 41 is to allow passage of the R.F. signal into the laser diode 23 and at the same time to prevent the R.F. source from offsetting the D.C. bias current. Although the exact value of this capacitance will vary depending upon the relative magnitude and frequency of the signals involved, capacitances in the order of 100 picofarads would be typical.

The inductor 43 performs a function basically opposite of the function performed by the capacitor 41. More specifically, the inductor 43 allows passage of the bias current into the laser diode 23, while at the same time prevents the current source from draining the R.F. coming from the capacitor 41. Although the value of the inductor 43 will similarly vary depending upon the relative magnitude and frequency of the signals involved, its value will typically be around one microhenry.

The light output of the laser diode 23 is then coupled to the fiber optic cable 7, using the same techniques and with the same considerations as was discussed above with respect to FIG. 2.

The amount of delay, of course, will be directly proportional to the length of the fiber optic cable 7. And in practice, different lengths can easily be switched in and out as needed.

When long delays are desired, as is often the case, the length of the fiber optic cable 7 will be such that it may be wound in a coil in order to cause the test set to be small in size. Although almost any type of coiling is acceptable, in the preferred embodiment applicant chooses to keep the radius of all windings at no less than one inch. Otherwise, the level of undesirable loss may increase substantially.

The material of fiber optic cable 7 should be selected so as to minimize loss, distortion and dispersion. Generally, this will mean that the diameter of the cable should match the wavelength of the laser light and that "single mode" fiber optic material should be used.

It is also preferred that the laser light emitted by the laser diode 23 be very short in length, typical around 1.3 to 1.5 micrometers. Although longer or shorter wave lengths can be used, these other wave lengths contribute to losses in the fiber optic material and increases in undesirable dispersion.

FIG. 4 is a schematic diagram of a preferred embodiment of the circuitry used to operate the optical detector 39 shown in FIG. 2. As shown in FIG. 4, the other end of the fiber optic cable 7 is coupled to the optical detector 39, one end of which is grounded. The other end of the optical detector 39 is connected to a capacitor 45 and an inductor 47. The other end of the capacitor 45 is connected to an R.F. pre-amplifier 49, and the other end of the inductor 47 is connected to a constant source of negative D.C. voltage $V_B$.

Just as with the laser diode 23, it is also necessary to bias the optical detector 39 to ensure that it always operates in its liner region. However, unlike the laser diode 23, the purpose of the bias is to reduce junction capacitance which might otherwise deteriorate its high frequency performance. This is done by delivering a constant negative voltage $V_B$ into the optical detector 39 through the aforementioned circuitry, which is also known as a bias-tee network. Although the exact amount of the negative voltage will depend upon the particular optical detector which is chosen and the relative magnitude and frequency of the signals involved, typically it will be around minus 10–20 volts.

The inductor 47 and the capacitor 45 perform a function similar to the inductor 43 and the capacitor 41 shown in FIG. 3. More specifically, the inductor 47 allows passage of the reverse biasing voltage into the optical detector 39 without allowing the R.F. component of the demodulated laser light to be loaded by the voltage source. Similarly, the capacitor 45 allows passage of the demodulated R.F. into the pre-amplifier 49 without allowing the pre-amplifier 45 to affect the reverse bias voltage. Although the exact values of the inductor 47 and the capacitor 45 will, again, depend upon the precise frequency and magnitude of the signal involved, they will typically be around 1 microhenry and 100 picofarads, respectfully.

An alternate technique for development and injection of the calibration signal source 7 shown in FIG. 1 is shown in FIG. 5.

As shown in FIG. 5, the signal from a calibration signal source 55 is injected directly into the low noise amplifier 5 at baseband frequency.

In order to generate the calibration signal which is used in the embodiment shown in FIG. 5, the R.F. test signal is sampled by a coupler 51 and delivered into an R.F. detector 53 which produces a D.C. signal having a magnitude which is proportional to the magnitude of the R.F. test signal. (The output of the mixer 4 in FIG. 1 can be used in place of the detector 53 in FIG. 5.) In turn, the D.C. developed from the detector 53 is delivered to the calibration signal source 55. The calibration signal source 55 in this embodiment simply generates a low frequency signal having a magnitude attenuated a known amount from the magnitude of the input D.C. signal, typically in the area of 60 db. As with the calibration signal source 7 shown in FIG. 1, the frequency of the low frequency signal is selected to be within the range of the anticipaed frequency by which the phase noise is offset from the test carrier.

Use of the technique described above and shown in FIG. 5 involves much simpler and less expensive hardware. However, because it does not account for test signal level changes caused by the frequency discriminator and the transfer function of the calibration signal source 55, calculations and/or measurements need to be made to determine the correct amount of attenuation required to provide the desired level (usually 60 db down) of the calibration signal relative to the R.F. carrier signal input. This attenuation factor is then built into the calibration signal source 55 through the use of a resistive divider network (not shown). As with the calibration technique shown in FIG. 1, the noise level relative to the R.F. carrier signal input can be easily determined based on the known magnitude of the calibration signal 55 compared to the displaced level of the phase noise (for a particular displayed frequency band). Once this attenuation factor is determined, it can be applied to all subsequent measurements.

Although the system disclosed in FIG. 2 uses a non-coherent optical fiber transmission technique, a coherent optical fiber transmission technique could alternatively be employed within the scope of the present invention, such as the coherent technique discussed by Basch and Brown in *Introduction to Coherent Optical Fiber Transmission,* published in May of 1985 in *IEEE Communications Magazine,* Vol. 23, No. 5. In this instance, a second laser is used as a local oscillator and heterodyned with the output of the fiber optic cable 7 at the output of the optical detector 39, using the techniques discussed in the article.

Although the test set described above has been described as being useful to measure phase noise in radar signals, it may also advantageously be used to measure a variety of noises in other types of R.F. signals. Moreover, although only certain embodiments of the present invention have been described, it is to be understood that the present invention is applicable to a broad variety of other embodiments, processes and parameters and that the present invention is defined and limited solely by the following claims.

What is claimed is:

1. A noise test set for analyzing noise present in a test signal comprising:
    a. light means for generating light;
    b. modulation means connected to said light means for modulating the light generated by said light means with the test signal;
    c. delay means connected to said modulation means for delaying the modulated light, said delay means including a fiber optic cable having two ends, one end of which is connected to said modulated light;
    d. demodulation means connected to the other end of said fiber optic cable for extracting from the modulated light the delayed test signal; and
    e. detector means connected to the undelayed test signal and to the delayed test signal for extracting the noise present in the test signal.

2. The noise test set of claim 1 wherein said light means emits laser light.

3. The noise test set of claim 2 wherein said light means further includes a laser diode and wherein said modulation means includes a bias-tee network connected to said diode.

4. The noise test set of claim 3 wherein said bias-tee network includes a capacitor and an inductor connected together at one end to said diode, the other end at said capacitor being connected to the test signal, and the other end of said inductor being connected to a source of constant D.C. current.

5. The noise test set of claim 2 wherein said fiber optic cable has a diameter which is matched to the frequency of the laser light.

6. The noise test set of claim 1 wherein said modulation means modulates the intensity of the light at the moment it is generated.

7. The noise test set of claim 1 wherein said demodulation means includes an optical detector.

8. The noise test set of claim 7 wherein said demodulation means further includes a bias-tee network connected to said optical detector.

9. The noise test set of claim 8 wherein said bias-tee network includes a capacitor and an inductor, each connected at one end to said optical detector, the other end of said capacitor being connected to deliver the demodulated R.F. output, and the other end of said inductor being connected to a source of constant D.C. voltage.

10. The noise test set of claim 1 wherein said light means generates a light of substantially constant intensity and wherein said modulation means modulates the light after the light is produced.

11. The noise test set of claim 10 wherein said modulation means includes a device which modulates the laser light using a pair of electrodes and wherein a potential is applied to said electrodes having a magnitude substantially proportional to the test signal.

12. The noise test set of claim 11 wherein said modulation means includes an interferometric modulator.

13. The noise test set of claim 12 wherein said interferometric modulator includes a wave guide embedded in an optical crystal.

14. The noise test set of claim 13 wherein said waveguide is made of titanium and wherein said optical crystal is made of lithium niobate.

15. The noise test set of claim 1 wherein said fiber optic cable is coiled and wherein no portion of said coil makes an arc having a radius less than one inch.

16. The noise test set of claim 1 wherein said fiber optic cable is a single mode type.

17. The noise test set of claim 1 wherein said detector means includes a mixer connected to said delay means.

18. The noise test set of claim 17 wherein said detector means further includes a phase shifter connected to the test signal and also to said mixer for delivering a signal to said mixer which is substantially 90 degrees out of phase with the delayed test signal delivered to said mixer from said delay means.

19. The noise test set of claim 1 further including a calibration signal source.

20. The noise test set of claim 19 wherein said calibration signal source is added to the test signal before the test signal enters said modulation means.

21. The noise test set of claim 19 wherein a coupler effectuates said addition.

22. The noise test set of claim 19 further including a low noise video amplifier connected to the output of said detector means and wherein said calibration signal source is injected directly into said low noise video amplifier.

23. The noise test set of claim 22 wherein the amplitude of said calibration signal source is substantially attenuated from the amplitude of the test signal.

24. The noise test set of claim 23 further including second detector means coupled to the test signal and connected to said calibration signal source for generating a D.C. signal having an amplitude proportional to the amplitude of the test signal, said D.C. signal controlling the amplitude of said calibration signal source.

25. The noise test set of claim 1 further including:
 a. a power divider connected to the test signal for dividing the test signal into two segments, one of said segments being delivered to said modulation means, the other of said segments being delivered to said detector means;
 b. a low noise amplifier connected to the output of said detector means; and
 c. a wave analyzer connected to the output of said low noise amplifier.

26. The noise test set of claim 25 wherein said wave analyzer is a spectrum wave analyzer.

27. A noise test set for analyzing noise present in a test signal comprising:
 a. a frequency discriminator for decorrelating the noise present in the test signal, said frequency discriminator having an output;
 b. detector means connected to the test signal for generating a D.C. signal having an amplitude proportional to the amplitude of the test signal;
 c. calibration signal means connected to the D.C. signal generated by said detector means for generating an A.C. calibration signal having an amplitiued proportional to the amplitude of the D.C. signal but substantially attenuated therefrom by a predetermined amount; and
 d. amplifier means having two inputs, one of said imputs being connected to the calibration signal generated by said calibration signal means, the other of said inputs being connected to the output of said frequency discriminator, for injecting said calibration signal onto the output of said frequency discriminator.

28. A noise test set for analyzing noise present in a test signal comprising:
 a. a laser diode for generating laser light;
 b. modulation means connected to the test signal for modulating the laser light generated by said laser diode with the test signal;
 c. a fiber optic cable having two ends, one of which is connected to the modulated laser light, said fiber optic cable having a diameter which is matched to the frequency of the laser light, being of a single mode type, and being coiled but having no portion of said coil making an arc with a radius less than one inch;
 d. a detector connected to the other end of said fiber optic cable for extracting the delayed test signal from the modulated laser light;
 e. a phase shifter connected to the test signal for producing a signal which is substantially 90 degrees out of phase with the delayed test signal coming from said detector; and
 f. a mixer connected to the output of said phase shifter and to the output of said detector for extracting the noise present in the test signal.

* * * * *